United States Patent
Yoon et al.

(10) Patent No.: US 7,233,017 B2
(45) Date of Patent: Jun. 19, 2007

(54) MULTIBIT PHASE CHANGE MEMORY DEVICE AND METHOD OF DRIVING THE SAME

(75) Inventors: Sung Min Yoon, Daejeon (KR); Sangouk Ryu, Daejeon (KR); Woong Chul Shin, Daejeon (KR); Nam Yeal Lee, Daejeon (KR); Byoung Gon Yu, Daejeon (KR)

(73) Assignee: Electronics and Telecommunications Research Institute (KR)

( * ) Notice: Subject to any disclaimer, the term of this patent is extended or adjusted under 35 U.S.C. 154(b) by 0 days.

(21) Appl. No.: 11/082,054

(22) Filed: Mar. 15, 2005

(65) Prior Publication Data
US 2006/0091374 A1    May 4, 2006

(30) Foreign Application Priority Data
Nov. 4, 2004    (KR) ...................... 10-2004-0089162

(51) Int. Cl.
*H01L 47/00* (2006.01)
(52) U.S. Cl. .......................................... 257/5; 438/129
(58) Field of Classification Search ................ 257/3–5, 257/124, 246, E31.029; 438/95, 128–132
See application file for complete search history.

(56) References Cited

U.S. PATENT DOCUMENTS

| 5,536,947 | A | 7/1996 | Klersy et al. |
| 5,869,843 | A | 2/1999 | Harshfield |
| 6,429,449 | B1 | 8/2002 | Gonzalez et al. |
| 6,579,760 | B1 * | 6/2003 | Lung ........................ 438/257 |

OTHER PUBLICATIONS

Kelly Daly-Flynn et al., "InSbTe Phase-Change Materials for High Performance Multi-Level Recording," Jpn. J. Appl. Phys. vol. 42 (2003) pp. 795-799, Feb. 2003.
Bo Liu et al., "Nitrogen-implanted Ge2Sb2Te5 film used as multi-level storage media for phase change random access memory," Inst. of Physics Publ., Semicond. Sci. Technol. 19 (2004) L61-L64, Apr. 21, 2004.

* cited by examiner

*Primary Examiner*—David Vu
(74) *Attorney, Agent, or Firm*—Blakely Sokoloff Taylor & Zafman

(57) ABSTRACT

A multibit phase change memory device structured such that a plurality of individual phase change memory devices are aligned in a plan area or vertically, and a method of driving the same are provided. The multibit phase change memory device includes a phase change material layer having a plurality of contact portions being in contact with a heating electrode, and having a plurality of active regions, each active region forming a unit phase change memory device. The phase change material layer may be composed of one material layer in which the plurality of active regions are aligned in plural arrays. Alternatively, the phase change material layer may be composed of a plurality of phase change material layers in which one or plural active regions are respectively aligned in one array. The plurality of phase change material layers may be disposed in a same level of a plan area, or the plurality of phase change material layers may be respectively disposed on different plan areas in a same vertical line.

24 Claims, 5 Drawing Sheets

SET R
RESET ∞

SET 1/2 R
RESET ∞

SET 1/4 R
RESET ∞

|  | SW1 | SW2 | SW3 | TOTAL |
|---|---|---|---|---|
| STATE 1 | ON | ON | ON | 1/7 R |
| STATE 2 | OFF | ON | ON | 1/6 R |
| STATE 3 | ON | OFF | ON | 1/5 R |
| STATE 4 | OFF | OFF | ON | 1/4 R |
| STATE 5 | ON | ON | OFF | 1/3 R |
| STATE 6 | OFF | ON | OFF | 1/2 R |
| STATE 7 | ON | OFF | OFF | R |
| STATE 8 | OFF | OFF | OFF | ∞ |

MULTIBIT PHASE CHANGE MEMORY DEVICE AND METHOD OF DRIVING THE SAME

BACKGROUND OF THE INVENTION

This application claims the priority of Korean Patent Application No. 10-2004-0089162, filed on Nov. 4, 2004, in the Korean Intellectual Property Office, the disclosure of which is incorporated herein in its entirety by reference.

1. Field of the Invention

The present invention relates to a memory device using a phase change material and a method of driving the same, and more particularly, a multibit phase change memory device and a method of driving the same.

2. Description of the Related Art

In recent years, a nonvolatile memory device retaining stored data even with supplied power cut off has been dramatically developed in technology along with the demand increase of portable personal assistants. A flash memory device as a representative nonvolatile memory device is substantially involved in most of the markets for nonvolatile memory devices with the advantage of low costs of production based on silicon processing. However, the flash memory device has drawbacks of requiring a relatively high voltage for data storage and limiting the number of repeated data storage. Accordingly, efforts to overcome the drawbacks for next generation nonvolatile memory devices are actively studied.

The next generation nonvolatile memory devices are roughly classified into two types, i.e., capacitor type memory device and resistor type memory device. A representative example of the capacitor memory device is a ferroelectric memory device using ferroelectric material, and the ferroelectric memory device reads stored data types from the polarization direction of the ferroelectric capacitor. A ferroelectric oxide material is mostly used for the ferroelectric memory device, but recently, the nonvolatile memory device using a ferroelectric organic material is actively researched.

Representative examples of the resistor type memory device are a magnetic tunnel junction memory device and a phase change memory device. The magnetic tunnel junction memory device, namely "magnetic RAM: MRAM", has a structure in which a very thin insulating layer is inserted between two magnetic material layers, and operates to store data by controlling the spin polarization direction of the two magnetic material layers surrounding the insulating layer, and read stored data types from the magnitude of the tunnel current passing through the insulating layer, i.e., the resistance magnitude, in the cases that the spin polarization directions are same or different.

The phase change memory device, namely "phase-change RAM: PRAM", uses the characteristics of the phase change material in which resistance magnitude is changed in accordance with the crystal structure of the material. The phase change memory device stores data by controlling the crystal structure of a phase change material with the appropriate selection of current or voltage application, and reads stored data types from the change of the resistance magnitudes in accordance with the crystal structure of the phase change material.

The various nonvolatile memory devices exemplified as above have their own advantages and disadvantages. For example, ferroelectric memory devices have a long history to be studied, and satisfy most of the functions required for a next generation nonvolatile memory device, but have difficulties in the fabrication processing of making devices further scaled. Therefore, present technology is limited to realize a higher integration of flash memory devices.

In MRAMs, it is reported that operation characteristics of the device may be deteriorated with the miniaturization (or scaling) of devices, and power consumption of the device is necessarily increased along with the integrated devices while the operation speed of the device is very high.

On the contrary, PRAMs can use chalcogenide metal alloy-based phase change material which has been widely used for optical data storage devices such as CD rewritable (CD-RW), digital versatile disk (DVD), and the like. Further, as the fabrication processing of the phase change memory devices well matches with the fabrication processing for typical silicon-based devices, the phase change memory devices can be implemented with an integration degree equal to or greater than that of DRAM. Of course, there still remains a subject to further reduce consumption power for operation than ever, but seeing the results of technology development for PRAMs, they are recently noted as one of the most important non-volatile memory devices for next generation enabling to replace the existing flash memory devices.

Further, another advantage of the PRAM is to allow a multibit memory device being capable of storing plural memories in addition to 0 or 1 in one single device structure. This is required that the crystal structure of a phase change material is maintained a certain state other than fully crystallized structure or fully amorphous structure, and the state can be given by applying an appropriate electric energy, i.e., supply of a predetermined current. It is reported that a value of an intermediate state other than 0 or 1 can be achieved by applying a predetermined current signal. If such a multibit memory device having the function is realized, it is expected that the PRAM will replace all the markets for flash memory devices limited in integration degrees, and significantly increase the integration degree of memory devices. Accordingly, they are highly expected as non-volatile memory devices for next generation portable digital personal assistants.

However, in order to substantially realize such a multibit phase change memory device, a method quite different from the conventional manufacture method for typical PRAMs must be selected. The reason can be explained as follows.

First, a phase change material used for the multibit phase change memory device must exhibit a linear characteristics depending on applied electrical or thermal energy when it is changed from amorphous structure to crystal structure, or from crystal structure to amorphous structure. If a phase change material not linearly varied in its characteristics is used, peripheral circuits with very complicated structures must be prepared to determine operation conditions during a storage or a reading operation of data in intermediate states to drive a device. However, the phase change material satisfying the characteristics has not be developed up to now, and research examples for the required characteristics have not been reported, either.

Secondly, it has not studied about a method of driving such a multibit phase change memory device, and it is expected to adopt a method of appropriately controlling a pulse-type electrical signal of a predetermined level. In specific, there are examples, such as a method of controlling an amount of the thermal energy actually applied to a phase change material by adjusting the absolute value (magnitude of an applied signal) of a pulse-type electrical signal, and a method of controlling an amount of the thermal energy actually applied to a phase change material by changing the pulse width (applied time) of a pulse-type electrical signal. The methods are closely related with a crystallization rate or amorphization rate of the phase change material, and unless a method of arbitrarily controlling the crystallization rate or amorphization rate if necessary is developed, a driving operation of the device is very difficult to realize.

In consideration of the reasons, it is required to develop a new phase change material, which has not been studied, in order to manufacture a multibit phase change memory device and successfully realize the operation characteristics, and to study and research the material in detail. Therefore, much time is expected to take until verifying stable operations of the multibit phase change memory device, based on the current technology for the devices.

SUMMARY OF THE INVENTION

The present invention provides a multibit phase change memory device being structured to realize a multibit memory function by employing an existing phase change material without the use of a new material.

Further, the present invention provides a method of driving a multibit phase change memory device for storing or reading plural information data.

According to an aspect of the present invention, there is provided a multibit phase change memory device including a first insulating layer formed on a semiconductor substrate; a lower electrode formed on the first insulating layer; a heating electrode being in contact with the lower electrode; a phase change material layer having a plurality of contact portions being in contact with the heating electrode, and having a plurality of active regions, each active region forming a unit phase change memory device; a second insulating layer defining the active region between the heating electrode and the phase change material layer; and an upper electrode being in contact with a predetermined portion of the phase change material layer.

The phase change material layer may be composed of one phase change material layer in which the active regions are aligned in plural arrays. Or, the phase change material layer may be composed of a plurality of phase change material layers in which one or plural active regions are respectively aligned in one array. The plurality of phase change material layers may be disposed in a same level of a plan area, or the plurality of phase change material layers may be respectively disposed on different plan areas in a same vertical line.

Preferably, a plurality of unit phase change memory devices respectively formed by the plurality of active regions have one upper electrode in common.

In an exemplary embodiment of the present invention, a plurality of unit phase change memory devices respectively formed by the plurality of active regions are aligned in one array, and the plurality of unit phase change memory devices forming one array have one lower electrode or one heating electrode.

In an exemplary embodiment of the present invention, the phase change material layer includes a plurality of device areas, each area having one or a plurality of unit phase change memory devices, and the lower electrode includes a plurality of lower electrodes respectively corresponding to the plurality of device areas. The plurality of device areas have one upper electrode in common.

The plurality of device areas may include a first device area composed of one unit phase change memory device; a second device area composed of two unit phase change memory devices; and a third device area composed of four unit phase change memory devices.

In an exemplary embodiment of the present invention, the phase change material layer includes a plurality of unit layers in a stack structure, which respectively include one or a plurality of unit phase change memory devices and are disposed in different plan areas, and the lower electrode includes a plurality of lower electrodes respectively corresponding to the plurality of unit layers. Preferably, the plurality of unit layers have one upper electrode in common.

The plurality of unit layers may include a first unit layer composed of one unit phase change memory device; a second unit layer composed of two unit phase change memory devices; and a third unit layer composed of four unit phase change memory devices.

According to another aspect of the present invention, there is provided a method of driving a multibit phase change memory device including plural arrays respectively having one or a plurality of unit phase change memory devices, and the method includes switching ON or OFF a memory state of each array among the plural arrays; and storing or reading a resistance value changed in accordance with combination of ON or OFF of each array.

Therefore, the multibit phase change memory device according to the present invention realizes a nonvolatile memory device having multibit memory function without employing a new phase change material layer or a specific driving method for devices, or enlarging the size of an entire device.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
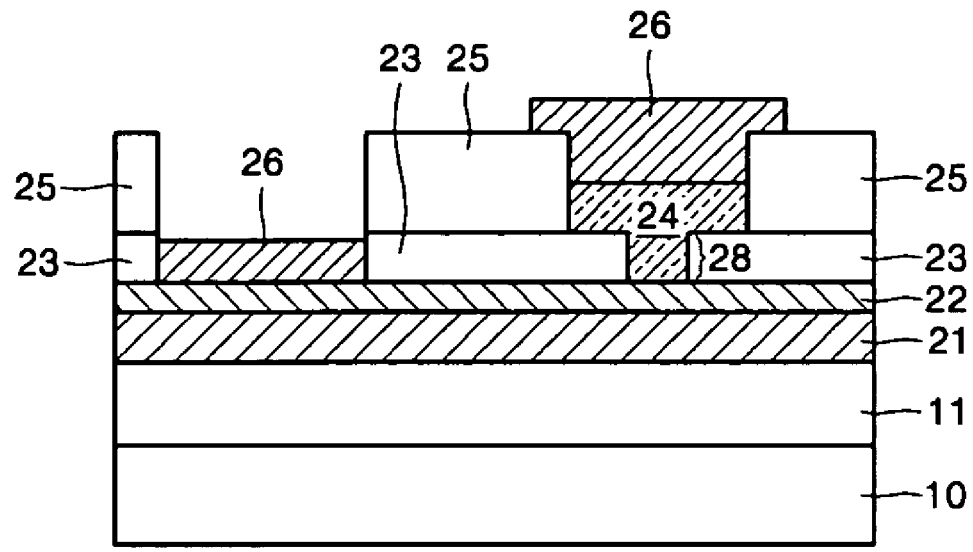
FIG. 1 is a sectional view illustrating essential parts of a unit phase change memory device to realize a multibit phase change memory device according to a first embodiment of the present invention.

The present invention will now be described more fully hereinafter with reference to the accompanying drawings, in which preferred embodiments of the invention are shown. This invention may, however, be embodied in many different forms and should not be constrained as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout the specification.

FIG. 1 is a sectional view illustrating essential parts of a unit phase change memory device to realize a multibit phase change memory device according to a first embodiment of the present invention.

Referring to FIG. 1, a first insulating layer 11 is formed on a silicon semiconductor substrate 10, and a stack structure 20 of the phase change memory device of the present invention is formed on the first insulating layer 11.

The first insulating layer 11 may be a silicon insulating layer, for example, formed by thermally oxidizing the surface of the semiconductor substrate 10. However, the first insulating layer 11 is not necessarily a silicon insulating layer, and may be formed of any material which can electrically or thermally insulate the semiconductor substrate 10 and the stack structure 20 of the phase change memory device.

The stack structure 20 includes a lower metal electrode 21, a heating metal electrode 22, a second insulating layer 23, a phase change material layer 24, a third insulating layer 25, and an upper metal electrode 26, which are sequentially formed on the first insulating layer 11. For example, the second insulating layer 23 and the third insulating layer 25 may be formed of silicon oxide layers.

The lower metal electrode 21 functions as a lower terminal of the phase change memory device, and can be formed by a typical metal electrode formation method. The lower metal electrode 21 is formed of a metal electrode of a low resistance generally used. There are platinum (Pt), tungsten (W), titanium tungsten alloy (TiW), and the like as representative examples of the material forming the lower metal electrode 21.

The heating metal electrode 22 functions to generate the heat sufficient to change the crystal structure of the material of the phase change material layer 24 at the contact portion of the heating metal electrode 22 and the phase change material layer 24. The function can be realized by the current supplied through the lower metal electrode 21, and thus, the resistance of the heating metal electrode 22 is relatively high in comparison with that of a normal metal electrode. Therefore, the material of the heating metal electrode 22 is important to determine the operation characteristics of the phase change memory device. Further, as the formation method of the material is also important to affect the material characteristics, it must be carefully selected. There are titanium nitride (TiN), titanium oxynitride (TiON), titanium aluminium nitride (TiAlN), tantalum aluminium nitride (TaAlN), tantalum silicon nitride (TaSiN), and the like as representative examples of the material forming the heating metal electrode 22.

The second insulating layer 23 and the third insulating layer 25 function to electrically insulate the phase change material layer 24, the heating metal electrode 22, and the lower metal electrode 21, and the phase change material layer 24 and the upper metal electrode 26 respectively. Also, the insulating layers function to contact the phase change material layer 24 and the heating metal electrode 22 at just a small portion, and thermally insulate the respective materials. The second insulating layer 23 and the third insulating layer 25 are necessarily formed at a low temperature in order to prevent the heating metal electrode 22 from be oxidized during the formation of the insulating layers. Particularly, by the low temperature process for forming the third insulating layer 25, the oxidation of the phase change material layer 24 is prevented and also, the crystal structure of the phase change material layer 24 is not much changed.

Since the heat transfer characteristics of the second insulating layer 23 and the third insulating layer 25 significantly affect the operation characteristics of the phase change memory device, it is necessary to carefully select the material of the insulating layers. The second insulating layer 23 and the third insulating layer 25 may be formed of, for example, a silicon oxide layer, a silicon nitride layer, or an insulating layer based on a silicon group, and in cases, may be formed of an organic insulating layer formed in a low temperature.

The phase change material layer 24 is the most key element to form the phase change memory device, and preferably, is composed of an alloy of chalcogenide group metal elements. The phase change material has various phase change characteristics depending on the component elements and the composition of a metal alloy, the material plays an important role in the operation of the phase change memory device. There are Ge, Se, Sb, Te, Sn, As, etc. as representative examples of the chalcogenide group metal elements to form the phase change material layer 24, and the chalcogenide phase change material can be prepared by the appropriate mixture of the elements. In addition to the composition of the chalcogenide group metal elements, Ag, In, Bi, Pb, etc. elements may be mixed in order to improve the characteristics of the phase change material layer 24. The phase change material layer 24 may be composed of $Ge_2Sb_2Te_5$ having a composition ratio of 2:2:5 of Ge:Sb:Te in the application of an optical storage apparatus. Various methods such as a co-sputtering method for layer deposition or electron beam deposition method with single target may be used in order to form the phase change material layer 24.

The upper metal electrode 26 functions as an upper terminal of the phase change memory device, and may be composed of a low resistance metal generally used like the material of the lower metal electrode 21.

Referring to FIG. 1, a contact portion of the phase change material layer 24 with the heating metal electrode 22 forms an active region 28 of one unit phase change memory device.

Figure 2A:
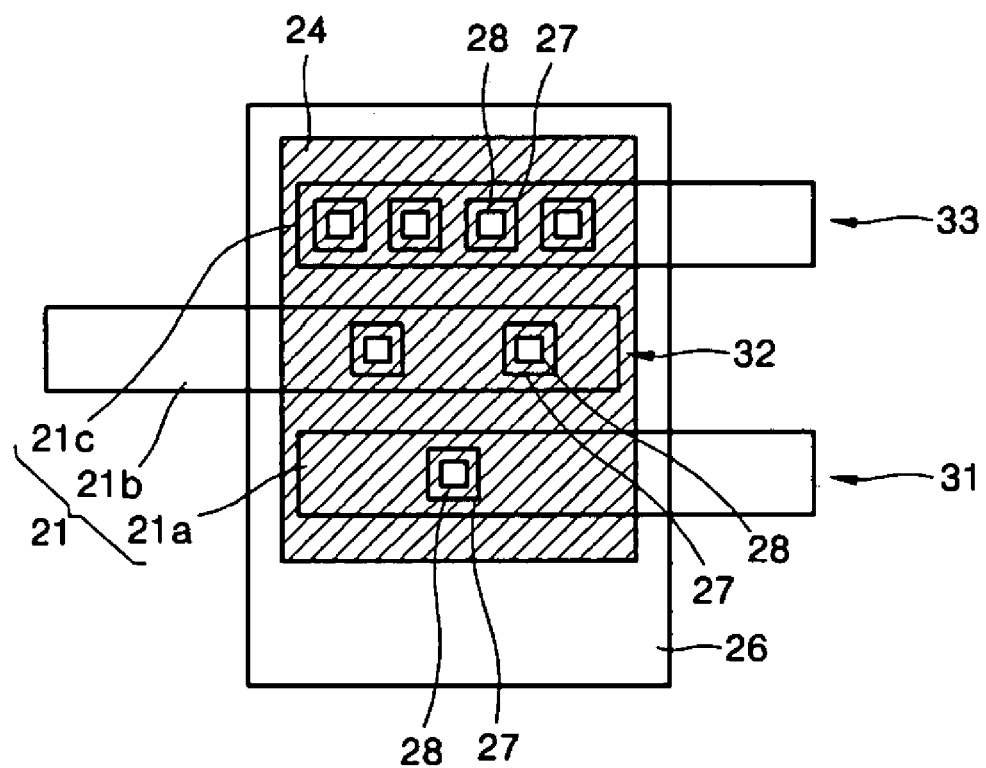
FIG. 2A is a plan view of the layout illustrating a multibit phase change memory device according to a second embodiment of the present invention.
Figure 2B:
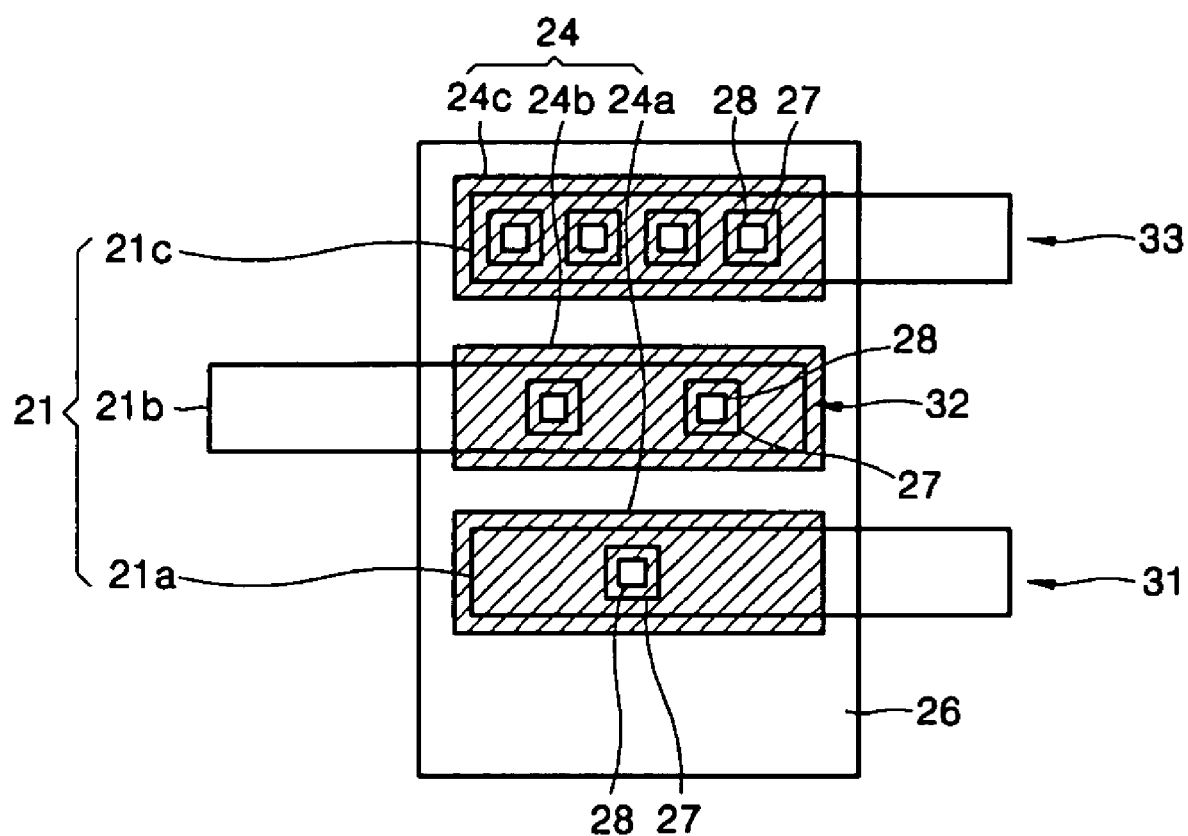
FIG. 2B is a plan view of the layout illustrating a multibit phase change memory device according to a third embodiment of the present invention.

FIGS. 2A and 2B are plan views of the layouts respectively illustrating multibit phase change memory devices according to second and third embodiments of the present invention.

FIG. 2A illustrates that a plurality of unit multibit phase change memory devices shown in FIG. 1 according to the present invention are aligned with an array type. That is, seven memory devices of the mutibit phase change memory devices according to the present invention are aligned with an array type. In this case, the phase change material layer 24 forms one layered material layer in which a plurality of the active regions 28 in a same level of a plan area are aligned with an array type, and all of the unit phase change memory devices having the plurality of active regions 28 are not necessarily driven independently.

The structure of the multibit phase change memory device will be described in more detail in reference to FIG. 2A. The seven unit phase change memory devices are formed below one upper metal electrode 26, and are formed on their respective lower metal electrodes 21 and the heating metal electrodes 22 (not shown in FIG. 2A). That is, one unit phase change memory device, and two and four unit phase change memory devices, which are driven concurrently in each group, have respective lower metal electrodes 21a, 21b, 21c, and the heating metal electrode. The groups of unit phase change memory devices respectively form a first device area 31, which is composed of one unit phase change memory device, a second device area 32, which is composed of two unit phase change memory devices, and a third device area 33, which is composed of one four phase change memory devices. In FIG. 2A, the reference number "27" refers to a contact region of the upper metal electrode 26 and the phase change material layer 24.

Here, the heating metal electrode 22 is not necessarily disposed across the overall area of the lower electrode 21 to overlap each other, and may be disposed at least below the active regions 28 of the unit phase change memory devices at a minimum. FIG. 2A illustrates an example that the unit phase change memory devices concurrently driven in the first, second, and third device regions 31, 32, 33 are respectively structured by one, two, and four devices, and the example is just illustrative but not restrictive. Therefore, the various arrangement can be made in accordance with desired plans.

FIG. 2B illustrates a modified example of the structure shown in FIG. 2A, which is basically same in that a plurality of unit phase change memory devices are formed in one phase change material layer 24. In FIG. 2B, the phase change material layer 24 is divided into plural layers, in which one or plural active regions 28 are respectively formed in a plurality of phase change material layers 24a, 24b, 24c, which are respectively aligned in an array. Further, the plurality of phase change material layers 24a, 24b, 24c are divided in a same level of a plan area into respective device areas. The lower metal electrode 21 includes a plurality of lower metal electrodes 21a, 21b, 21c corresponding to the respective device areas. Like reference numbers in FIG. 2B refer to like elements in FIG. 2A.

In the structure of the multibit phase change memory devices shown in FIG. 2A, the driving state of any one unit phase change memory device formed on one lower electrode may badly affect the phase change material layer formed on other lower electrode, and so, the unit phase change memory device may show unexpected abnormal driving state. However, when the structure of FIG. 2B is employed, such a possibility of the unexpected operation can be prevented in advance. Further, an additional separate process is not required to form the phase change material layer 24 into a plurality of phase change material layers 24a, 24b, 24c as above, each phase change material layer commonly using one lower metal electrode selected from the lower metal electrodes 21a, 21b, 21c with a corresponding device area among the device areas 31, 32, 33.

Each of the multibit phase change memory device shown in FIGS. 2A and 2B according to the present invention operates by driving three lower electrodes and one upper electrode, and has a 3-bits memory function. However, the number of bits of the memory device operated in multi-bits according to the present invention is not limited to 3 bits, and it is possible to increase the number of bits by enlarging the structure of the memory device using the same method as above within the scope of the present invention which is apparent to those skilled in the art.

Figure 3:
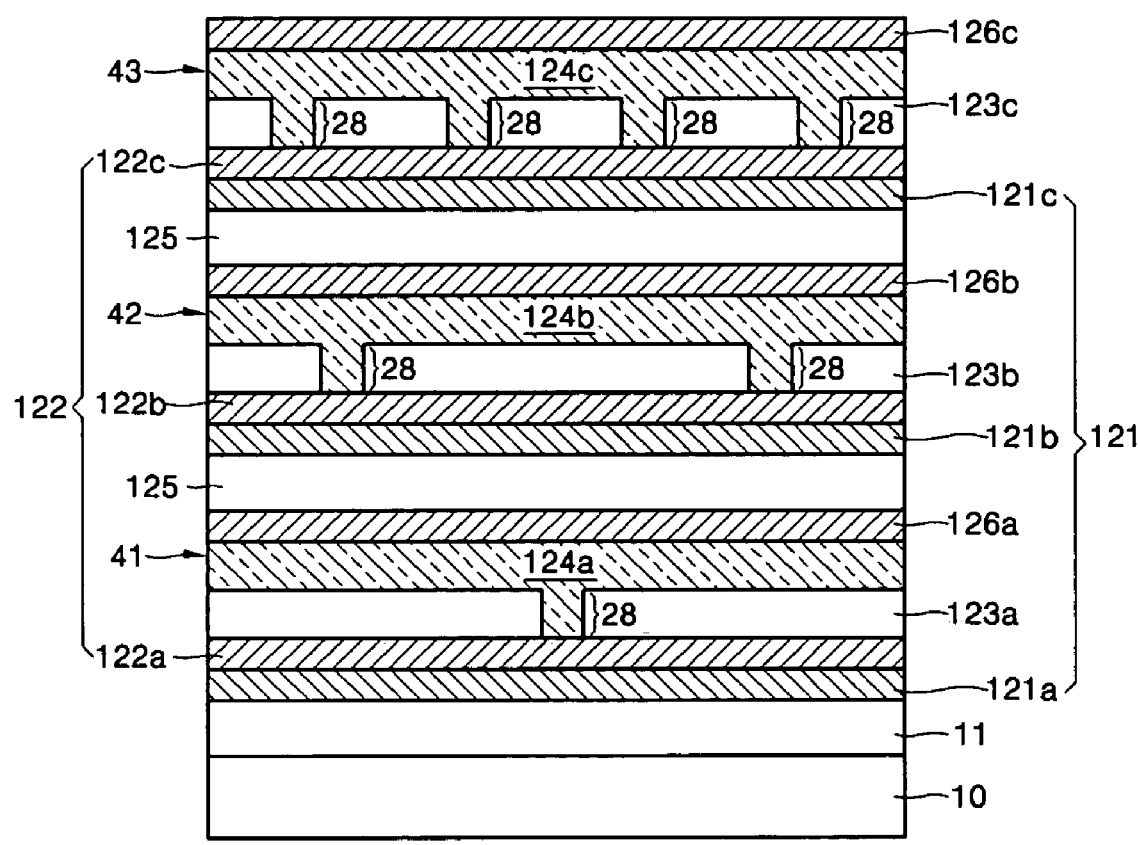
FIG. 3 is a sectional view illustrating essential parts of a multibit phase change memory device according to a fourth embodiment of the present invention.

FIG. 3 is a sectional view illustrating essential parts of a multibit phase change memory device according to a fourth embodiment of the present invention.

The phase change memory device shown in FIG. 3 is different from the structures of FIGS. 1, 2A and 2B in that unit phase change memory devices are stacked in a vertical direction not a horizontal direction. That is, a plurality of phase change material layers 124a, 124b, 124c are respectively formed in different vertical level of plan areas. In FIG. 3, same or similar reference numbers as in FIGS. 1, 2A, 2B refer to same elements, and the detailed description for these elements will be omitted to avoid repetition.

Describing in more detail with reference to FIG. 3, a first insulating layer 11, lower metal electrodes 121a, 121b, 121c, and heating metal electrodes 122a, 122b, 122c are sequentially stacked on a semiconductor substrate 10. Second insulating layers 123a, 123b, 123c for defining an active region 28 of one unit phase change memory device are formed on the heating metal electrodes 122a, 122b, 122c. Phase change material layers 124a, 124b, 124c are respectively formed on the second insulating layers 123 to form the active regions 28. Upper metal electrodes 126a, 126b, 126c are respectively formed on the phase change material layers 124a, 124b, 124c. The upper metal electrodes 126a, 126b, 126c are connected to each other by one electrode pad (not shown). Third insulating layers 125 are respectively formed between the unit layers 41, 42, 43 for insulation of the unit layers, each unit layer including each of the phase change material layers 124a, 124b, 124c.

As described above, in the structure shown in FIG. 3, unit phase change memory devices are repeatedly stacked in a vertical direction to form a stack structure.

In FIG. 3, a stack structure of the phase change memory device including three unit layers 41, 42, 43 is illustrated to form the 3 bits phase change memory device as described in reference to FIGS. 2A and 2B. Here, a first unit layer 41 among the three unit layers 41, 42, 43 is composed of one unit phase change memory device, a second unit layer 42 is composed of two unit phase change memory devices, and a third unit layer 43 is composed of four unit phase change memory devices.

Further, as described above, since the upper metal electrodes 126a, 126b, 126c are connected to each other by one electrode pad (not shown), the structure provides an effect that the unit phase change memory devices commonly have one upper electrode as the cases shown in FIGS. 2A and 2B.

The multibit phase change memory device according to the present invention shown in FIG. 3 operates by driving three lower electrodes and one upper electrode, and has a 3-bit memory function. However, the number of bits of the multibit memory device of the present invention is not limited to 3 bits, and it can be increased by enlarging the structure of the memory device using the same method as above within the scope of the present invention which is apparent to those skilled in the art.

The multibit phase change memory device according to the present invention structured as exemplified in FIG. 3 provides an effect of reducing the space for the entire elements in comparison with those of FIGS. 2A and 2B.

Figure 4A:
FIGS. 4A, 4B and 4C are equivalent circuit diagrams illustrating phase change memory devices of the multibit phase change memory devices during memory storage operations according to the present invention.
Figure 4B:
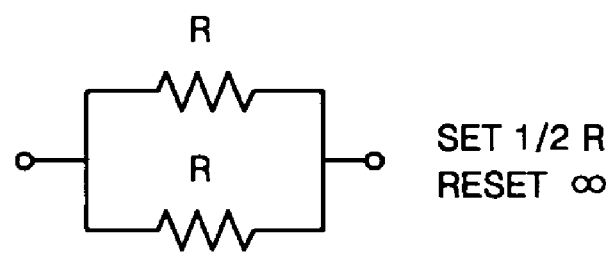
Figure 4C:
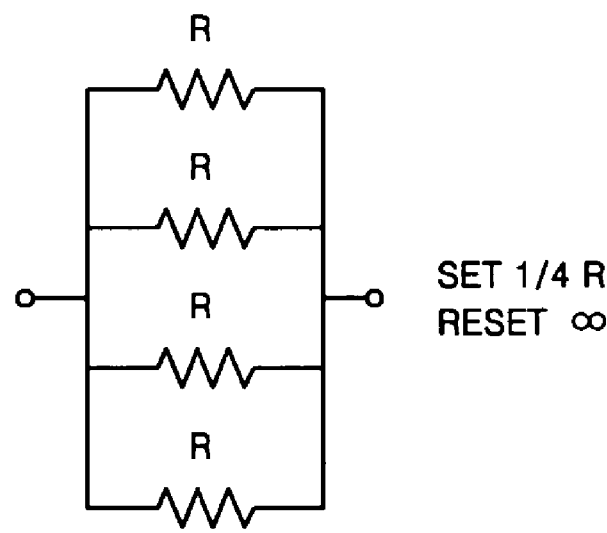

FIGS. 4A, 4B and 4C are equivalent circuits diagrams of the phase change memory devices shown in FIGS. 2A, 2B, and 3 during the memory storage operation by the multibit phase change memory devices of the present invention. In more specific, FIG. 4A is an equivalent circuit diagram of a first device area 31 of FIGS. 2A and 2B or a first unit layer 41 of FIG. 3. FIG. 4B is an equivalent circuit diagram of a second device area 32 of FIGS. 2A and 2B or a second unit layer 42 of FIG. 3. FIG. 4C is an equivalent circuit diagram of a third device area 33 of FIGS. 2A and 2B or a third unit layer 43 of FIG. 3.

Referring to FIGS. 4A, 4B, and 4C, the multibit phase change memory devices in the embodiments have one, two, and four unit phase change memory devices respectively, and each group of the unit phase change memory devices commonly uses one lower electrode, and all seven of the unit phase change memory devices have one common upper electrode. Therefore, when storing data, in the multibit phase change memory device having a same lower electrode in each group of one, two, and four unit phase change memory devices individually operable, the equivalent circuit for each device area 31, 32, 33 or unit layer 41, 42, 43 can show a resistance which is equal in magnitude, component resistances being connected in parallel. The operation of storing data will be described in more detail below.

For convenience of explanation, the state that the phase change material layer is changed to crystal structure so that a resistance is lowered is defined as a SET state. At this state, the resistance value is R. On the contrary, the state that the phase change material layer is changed to amorphous structure so that a resistance is increased is defined as a RESET state. At this state, the resistance value is very high, and is referred to as infinite ($\infty$). The resistance values at actual SET and RESET states are important factors to determine the operation of the phase change memory device, and may be significantly varied depending on the characteristics of the phase change material layer and the structure of the phase change memory device.

In the description of operating the multibit phase change memory device here, the resistance of a RESET state is referred to as infinite ($\infty$). This is because the RESET resistance is much higher than the SET resistance, the equivalent circuit can show the state as infinite.

In the first device area 31 or the first unit layer 41, which is composed of one unit phase change memory device, the resistance of a SET state is R, and the resistance of a RESET state is infinite. In the second device area 32 or the second unit layer 42, which is composed of two unit phase change memory devices, the resistance of a SET state is ½ R, and the resistance of a RESET state is infinite. In the third device area 33 or the third unit layer 43, which is composed of four unit phase change memory devices, the resistance of a SET state is ¼ R, and the resistance of a RESET state is infinite.

Figures 5, 6:
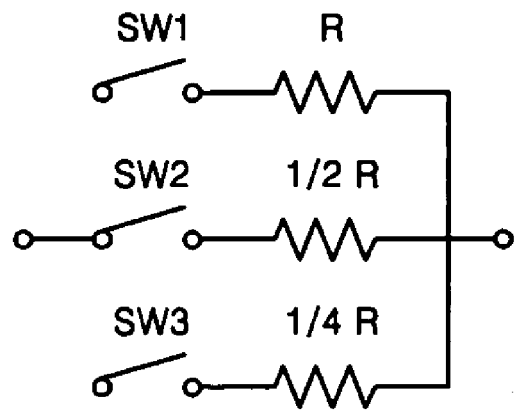
FIG. 5 is an equivalent circuit diagram illustrating a phase change memory device of the multibit phase change memory device during memory reading operations according to the present invention.
FIG. 6 is a table illustrating an example of a driving method of the multibit phase change memory device according to the present invention.

FIG. 5 is an equivalent circuits diagram of the memory devices shown in FIGS. 2A, 2B, and 3 during the memory read operation in the multibit phase change memory device according to the present invention.

Referring to FIG. 5, in the multibit phase change memory device according to the present invention, the memory states can be changed depending on the data storage states of each device area 31, 32, 33 or each unit layer 41, 42, 43, and the equivalent circuit at this state can be shown in FIG. 5.

In specific, the data storage states of each device area 31, 32, 33 or each unit layer 41, 42, 43 in the multibit phase change memory device having one, two, or four unit phase change memory devices, a SET state can be indicated as R, ½ R, and ¼ R, and a RESET state can be indicated as infinite. Also, it is possible to consider by changing each circuit structure including an electrical switch before the terminal for read signal input. In the equivalent circuit diagram of FIG. 5, each device area 31, 32, 33 or each unit layer 41, 42, 43 can contribute to a resistance when it is in a SET state. Thus, if each switch SW1, SW2, SW3 is closed (ON), it indicates a SET state, and if each switch SW1, SW2, SW3 is open (OFF), it indicates a RESET state. That is, if each switch SW1, SW2, SW3 is closed (ON), a phase change material layer is lowered in resistance with a crystal structure, and if each switch SW1, SW2, SW3 is open (OFF), a phase change material layer is increased in resistance with an amorphous structure.

FIG. 6 is a table illustrating an example of a driving method of the multibit phase change memory device according to the present invention.

Referring to FIG. 6, a driving method of the entire multibit phase change memory device can be controlled with variance of the table in accordance with the memory storage method of the device described in reference to FIGS. 4A, 4B, 4C, and the memory reading method of the device described in reference to FIG. 5. That is, different memory values having eight STATEs required to drive three device areas 31, 32, 33 or three unit layers 41, 42, 43 can be shown.

Describing the result with a more specific example, in the case that all of the device areas or all of the unit layers are in amorphous structure, that is, all of the switches, SW1, SW2, SW3 are indicated OFF, a resistance value is infinite (STATE 8). On the contrary, in the case that all of the device areas or all of the unit layers are in crystal structure, that is, all of the switches, SW1, SW2, SW3 are indicated ON, a resistance value is 1/7 R (STATE 1). As shown in FIG. 6, other cases but the two cases, that is, STATE 2 through 7 respectively show different values of resistance depending on the change in states of each device area 31, 32, 33 or each unit layer 41, 42, 43 constituting the multibit phase change memory device composed of one, two, or four unit phase change memory devices respectively.

In order to realize the multibit phase change memory device according to the present invention successfully in the embodiments, it is preferable to satisfy the conditions as follows.

First, the resistance value of SET or RESET of each of all of the unit phase change memory devices constituting the multibit phase change memory device of the present invention must be same. The fabrication of the device must be implemented to satisfy the condition because the condition sensitively affects the resistance value of a SET state, which is relatively low in comparison with the very high resistance value of a RESET state.

Secondly, the region, the resistance state of which is changed in the multibit phase change memory device of the present invention, must be limited to the active region of the device. This is because that the crystal structure of other regions is changed by a current signal applied for memory storage to affect the crystal structure of the phase change material layers of neighboring phase change memory devices. For the purpose, the heating metal electrode below the phase change material layer must have an appropriate resistance value, and if necessary, the phase change material layer may be divided into plural component phase change material layers as described in reference to FIG. 2B.

Thirdly, in the multibit phase change memory device according to the present invention, the resistance value in a SET state must not be too small in order to verify the reliability for the plurality of resistance values as described in reference to FIG. 6. If the resistance value R is too small, a margin for an intermediate resistance value showing a mutibit memory function is reduced, thereby deteriorating a reliability of the entire multibit phase change memory device.

As described above, the multibit phase change memory device according to the present invention is structured such that a plurality of individual unit phase change memory devices are arranged with an array type in a transverse direction or vertical direction. In order to drive the multibit phase change memory device of the present invention being characterized in structure as above, the plurality of unit memory devices are driven concurrently via the common lower electrode.

Further, the multibit phase change memory device of the present invention does not need to newly employ a material for the phase change material layer, or use a particularly new driving method, and allows to realize a non-volatile memory device having a multibit memory function without enlarging the size of the entire device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A multibit phase change memory device comprising:
    a first insulating layer formed on a semiconductor substrate;
    a plurality of lower electrodes formed on the first insulating layer;
    a plurality of heating electrodes being in contact with the plurality of lower electrodes;
    a phase change material layer having a plurality of contact portions being in contact with the heating electrodes, and having a plurality of active regions, each active region forming a unit phase change memory device;
    a second insulating layer defining the active region between the heating electrodes and the phase change material layer; and
    an upper electrode being in contact with each of the plurality of active regions of the phase change material layer;
    wherein the active regions of the phase change material layer include a (i) first active region group being in contact with a first lower electrode selected from the plurality of lower electrodes, (ii) a second active region group being in contact with a second lower electrode selected from the plurality of lower electrodes, and (iii) a third active region group being in contact with a third lower electrode selected from the plurality of lower electrodes, wherein the number of active regions in the first, second and third active region groups are different from one another;
    wherein the phase change material layer includes a plurality of arrays each of which includes one or more of the unit phase change memory devices, each array including a different quantity of the unit phase change memory devices from one another, wherein the number of arrays and the number of lower electrodes are the same.

2. The multibit phase change memory device of claim 1, wherein the phase change material layer is composed of one phase change material layer in which the active regions are aligned in plural arrays.

3. The multibit phase change memory device of claim 2, wherein a plurality of unit phase change memory devices respectively formed by the plurality of active regions are aligned in one array, and
    the plurality of unit phase change memory devices forming one array have one lower electrode or one heating electrode.

4. The multibit phase change memory device of claim 2, wherein the phase change material layer includes a plurality of device areas, each area having one or a plurality of unit phase change memory devices, and
    the lower electrode includes a plurality of lower electrodes respectively corresponding to the plurality of device areas.

5. The multibit phase change memory device of claim 4, wherein the plurality of device areas have one upper electrode in common.

6. The multibit phase change memory device of claim 4, wherein the plurality of device areas comprise:
    a first device area composed of one unit phase change memory device;
    a second device area composed of two unit phase change memory devices; and
    a third device area composed of four unit phase change memory devices.

7. The multibit phase change memory device of claim 2, wherein the phase change material layer comprises a plurality of unit layers in a stack structure, which respectively include one or a plurality of unit phase change memory devices and are disposed in different plan areas, and
    the lower electrode comprises a plurality of lower electrodes respectively corresponding to the plurality of unit layers.

8. The multibit phase change memory device of claim 7, wherein the plurality of unit layers have one upper electrode in common.

9. The multibit phase change memory device of claim 7, wherein the plurality of unit layers comprise:
    a first unit layer composed of one unit phase change memory device;
    a second unit layer composed of two unit phase change memory devices; and
    a third unit layer composed of four unit phase change memory devices.

10. The multibit phase change memory device of claim 1, wherein the phase change material layer is composed of a plurality of phase change material layers in which one or plural active regions are respectively aligned in one array.

11. The multibit phase change memory device of claim 10, wherein the plurality of phase change material layers are disposed in a same level of a plan area.

12. The multibit phase change memory device of claim 10, wherein the plurality of phase change material layers are respectively disposed on different plan areas in a same vertical line.

13. The multibit phase change memory device of claim 10, wherein a plurality of unit phase change memory devices respectively formed by the plurality of active regions are aligned in one array, and
    the plurality of unit phase change memory devices forming one array have one lower electrode or one heating electrode.

14. The multibit phase change memory device of claim 10, wherein the phase change material layer includes a plurality of device areas, each area having one or a plurality of unit phase change memory devices, and
    the lower electrode includes a plurality of lower electrodes respectively corresponding to the plurality of device areas.

15. The multibit phase change memory device of claim 3, wherein the plurality of device areas have one upper electrode in common.

16. The multibit phase change memory device of claim 14, wherein the plurality of device areas comprises:
    a first device area composed of one unit phase change memory device;
    a second device area composed of two unit phase change memory devices; and
    a third device area composed of four unit phase change memory devices.

17. The multibit phase change memory device of claim 10, wherein the phase change material layer comprises a plurality of unit layers in a stack structure, which respectively include one or a plurality of unit phase change memory devices and are disposed in different plan areas, and
the lower electrode comprises a plurality of lower electrodes respectively corresponding to the plurality of unit layers.

18. The multibit phase change memory device of claim 17, wherein the plurality of unit layers have one upper electrode in common.

19. The multibit phase change memory device of claim 17, wherein the plurality of unit layers comprise:
a first unit layer composed of one unit phase change memory device;
a second unit layer composed of two unit phase change memory devices; and
a third unit layer composed of four unit phase change memory devices.

20. The multibit phase change memory device of claim 1, wherein a plurality of unit phase change memory devices respectively formed by the plurality of active regions have one upper electrode in common.

21. A multibit phase change memory device comprising:
a first insulating layer formed on a semiconductor substrate;
a lower electrode formed on the first insulating layer;
a heating electrode being in contact with the lower electrode;
a phase change material layer having a plurality of contact portions being in contact with the heating electrode, and having a plurality of active regions, each active region forming a unit phase change memory device,
wherein the phase change material layer is composed of one phase change material layer in which the active regions are aligned in plural arrays,
wherein the phase change material layer includes a plurality of device areas, each area having one or a plurality of unit phase change memory devices,
wherein the plurality of device areas comprise: (a) a first device area composed of one unit phase change memory device; (b) a second device area composed of two unit phase change memory devices; and (c) a third device area composed of four unit phase change memory devices;
a second insulating layer defining the active region between the heating electrode and the phase change material layer; and
an upper electrode being in contact with a predetermined portion of the phase change material layer,
wherein the lower electrode includes a plurality of lower electrodes respectively corresponding to the plurality of device areas.

22. A multibit phase change memory device comprising:
a first insulating layer formed on a semiconductor substrate;
a lower electrode formed on the first insulating layer;
a heating electrode being in contact with the lower electrode;
a phase change material layer having a plurality of contact portions being in contact with the heating electrode, and having a plurality of active regions, each active region forming a unit phase change memory device,
wherein the phase change material layer is composed of a plurality of phase change material layer in which the active regions are aligned in one array,
wherein the phase change material layer includes a plurality of device areas, each area having one or a plurality of unit phase change memory devices,
wherein the plurality of device areas comprise: (a) a first device area composed of one unit phase change memory device; (b) a second device area composed of two unit phase change memory devices; and (c) a third device area composed of four unit phase change memory devices;
a second insulating layer defining the active region between the heating electrode and the phase change material layer; and
an upper electrode being in contact with a predetermined portion of the phase change material layer,
wherein the lower electrode includes a plurality of lower electrodes respectively corresponding to the plurality of device areas.

23. A multibit phase change memory device comprising:
a first insulating layer formed on a semiconductor substrate;
a lower electrode formed on the first insulating layer;
a heating electrode being in contact with the lower electrode;
a phase change material layer having a plurality of contact portions being in contact with the heating electrode, and having a plurality of active regions, each active region forming a unit phase change memory device,
wherein the phase change material layer is composed of one phase change material layer in which the active regions are aligned in plural arrays,
wherein the phase change material layer includes a plurality of unit layers in a stack structure, which respectively include one or a plurality of unit phase change memory devices and are disposed in different plan areas,
wherein the plurality of unit layers comprise: (a) a first unit layer composed of one unit phase change memory device; (b) a second unit layer composed of two unit phase change memory devices; and (c) a third unit layer composed of four unit phase change memory devices;
a second insulating layer defining the active region between the heating electrode and the phase change material layer; and
an upper electrode being in contact with a predetermined portion of the phase change material layer,
wherein the lower electrode includes a plurality of lower electrodes respectively corresponding to the plurality of unit layers.

24. A multibit phase change memory device comprising:
a first insulating layer formed on a semiconductor substrate;
a lower electrode formed on the first insulating layer;
a heating electrode being in contact with the lower electrode;
a phase change material layer having a plurality of contact portions being in contact with the heating electrode, and having a plurality of active regions, each active region forming a unit phase change memory device,
wherein the phase change material layer is composed of a plurality of phase change material layer in which the active regions are aligned in one array,
wherein the phase change material layer includes a plurality of unit layers in a stack structure, which respectively include one or a plurality of unit phase change memory devices and are disposed in different plan areas, wherein the plurality of unit layers comprise: (a) a first unit layer composed of one unit phase change memory device; (b) a second unit layer composed of two unit phase change memory devices; and (c) a third unit layer composed of four unit phase change memory devices;

a second insulating layer defining the active region between the heating electrode and the phase change material layer; and an upper electrode being in contact with a predetermined portion of the phase change material layer, wherein the lower electrode includes a plurality of lower electrodes respectively corresponding to the plurality of unit layers.

* * * * *